(12) United States Patent
Nystrom et al.

(10) Patent No.: US 11,175,492 B2
(45) Date of Patent: Nov. 16, 2021

(54) SUBSTRATE FOR SCANNING MIRROR SYSTEM

(71) Applicant: Microsoft Technology Licensing, LLC, Redmond, WA (US)

(72) Inventors: Michael James Nystrom, Redmond, WA (US); Wyatt Owen Davis, Bothell, WA (US); Jincheng Wang, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 184 days.

(21) Appl. No.: 16/538,694

(22) Filed: Aug. 12, 2019

(65) Prior Publication Data
US 2021/0048663 A1 Feb. 18, 2021

(51) Int. Cl.
*G02B 26/08* (2006.01)

(52) U.S. Cl.
CPC .................. *G02B 26/0858* (2013.01)

(58) Field of Classification Search
CPC  G02B 26/0841; G02B 26/105; G02B 26/085; G02B 26/0858; G02B 26/0833; G02B 26/101; B81B 3/0083; B81B 3/0086; B81B 2203/04
See application file for complete search history.

(56) References Cited

U.S. PATENT DOCUMENTS

| 7,697,115 | B2 | 4/2010 | del Puerto |
| 8,098,415 | B2 | 1/2012 | Kanno et al. |
| 8,125,699 | B2 | 2/2012 | Akedo et al. |
| 8,174,751 | B2 | 5/2012 | Jerman |
| 8,804,223 | B2 | 8/2014 | Park et al. |
| 10,048,489 | B2 | 8/2018 | Naono |
| 2004/0125472 | A1* | 7/2004 | Belt ................... G02B 26/0858 359/847 |
| 2009/0185254 | A1 | 7/2009 | Uchigaki et al. |

(Continued)

FOREIGN PATENT DOCUMENTS

| JP | 2004109456 A | 4/2004 |
| JP | 2010091791 A | 4/2010 |

(Continued)

OTHER PUBLICATIONS

"International Search Report and Written Opinion Issued in PCT Application No. PCT/US20/036893", dated Sep. 11, 2020, 12 Pages.

(Continued)

*Primary Examiner* — Jennifer D. Carruth
(74) *Attorney, Agent, or Firm* — Alleman Hall Creasman & Tuttle LLP

(57) ABSTRACT

A system that includes a substrate for microelectromechanical system (MEMS) scanning mirror systems is provided. The MEMS scanning mirror system includes a substrate that includes a ceramic body. An actuator frame is mounted on the ceramic body of the substrate. The actuator frame includes at least one moveable member. At least one actuator is operatively connected to the at least one moveable member such that the actuator is configured to move the at least one moveable member. A scanning mirror assembly is mounted to the at least one moveable member such that movement of the at least one moveable member moves the scanning mirror assembly.

20 Claims, 4 Drawing Sheets

(56) References Cited

U.S. PATENT DOCUMENTS

| 2014/0185117 A1 | 7/2014 | Hino et al. |
| 2015/0191349 A1 | 7/2015 | Wu et al. |
| 2016/0187643 A1 | 6/2016 | Booth et al. |

FOREIGN PATENT DOCUMENTS

| JP | 2017097108 A | 6/2017 |
| JP | 2017227754 A | 12/2017 |

OTHER PUBLICATIONS

Kim, et al., "Application of Al2O3-based polyimide composite thick films to integrated substrates using aerosol deposition method", In Journal of Materials Science and Engineering B, vol. 161, Issue 1-3, Apr. 15, 2009, pp. 104-108.

* cited by examiner

SUBSTRATE FOR SCANNING MIRROR SYSTEM

BACKGROUND

In a scanning display device, light from a light source is scanned in one or more directions via a controllable mirror to produce a viewable image. In some scanning display devices, laser light is reflected by a scanning mirror system at different angles to project a reflected laser light throughout a field-of-view (FOV). The scanning mirror system includes a scanning mirror assembly and a suitable actuator, such as a microelectromechanical system (MEMS) actuator, that rotates one or more scanning mirrors of the scanning mirror assembly to achieve a range of different reflection angles. For example, an MEMS actuator may rotate a scanning mirror about an axis in both horizontal and vertical directions to produce viewable images in a FOV. In different examples, the scanning mirror system may include a single mirror driven in both horizontal and vertical directions, or two mirrors separately driven in horizontal and vertical directions.

MEMS scanning mirror systems typically include an actuator frame and one or more actuators (e.g., piezoelectric (PZT) actuators) that move the actuator frame. The scanning mirror assembly is connected to the actuator frame such that movement of the actuator frame is translated to the scanning mirror assembly to thereby rotate the scanning mirror. In some MEMS scanning mirror systems, the actuator frame is mounted on a substrate that provides mechanical support to the actuator frame, the PZT actuators, and the scanning mirror assembly. The substrate may also provide an electrical interface to various components (e.g., the actuators) of the MEMS scanning mirror system.

The substrates of known MEMS scanning mirror systems are fabricated from a glass-reinforced plastic (i.e., fiberglass) material, for example FR4. However, the glass-reinforced plastic material of the substrate may flex during operation of the MEMS scanning mirror system, which can generate parasite modes that cause exaggerated and/or unintentional movement of the scanning mirror. For example, the substrate may flex sufficiently such that one or more other components (e.g., the actuator frame, the substrate, and the scanning mirrors, etc.) of the MEMS scanning mirror system resonates with magnitude that is comparable to the operating resonant mode of the scanning mirror. The exaggerated and/or unintentional movement of the scanning mirror caused by such resonant modes may decrease the power efficiency of the MEMS scanning mirror system (e.g., via parasite mode excitation, etc.) and/or even induce audible noise. Moreover, exaggerated and/or unintentional movement of the scanning mirror may lead to stress runaway of one or more components of the MEMS scanning mirror system and thereby reduce reliability of the MEMS scanning mirror system.

SUMMARY

Examples are disclosed that relate to substrates for microelectromechanical system (MEMS) scanning mirror systems. In one example, an MEMS scanning mirror system includes a substrate that includes a ceramic body. An actuator frame is mounted on the ceramic body of the substrate. The actuator frame includes at least one moveable member. At least one actuator is operatively connected to the at least one moveable member such that the actuator is configured to move the at least one moveable member. A scanning mirror assembly is mounted to the at least one moveable member such that movement of the at least one moveable member moves the scanning mirror assembly.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Examples are disclosed herein that relate to substrates for microelectromechanical system (MEMS) scanning mirror systems that reduce or eliminate undesired resonant modes that may cause exaggerated and/or unintentional movement of a scanning mirror of the MEMS scanning mirror system. The substrate examples disclosed herein thus reduce or eliminate audible noise (e.g., via the reduction or elimination of parasite mode excitation, etc.) and/or maintain the power efficiency of the MEMS scanning mirror system. Moreover, the substrate examples disclosed herein maintain component stresses generated during operation and/or assembly of the MEMS scanning mirror system and thereby increase reliability of the MEMS scanning mirror system.

Figure 1:
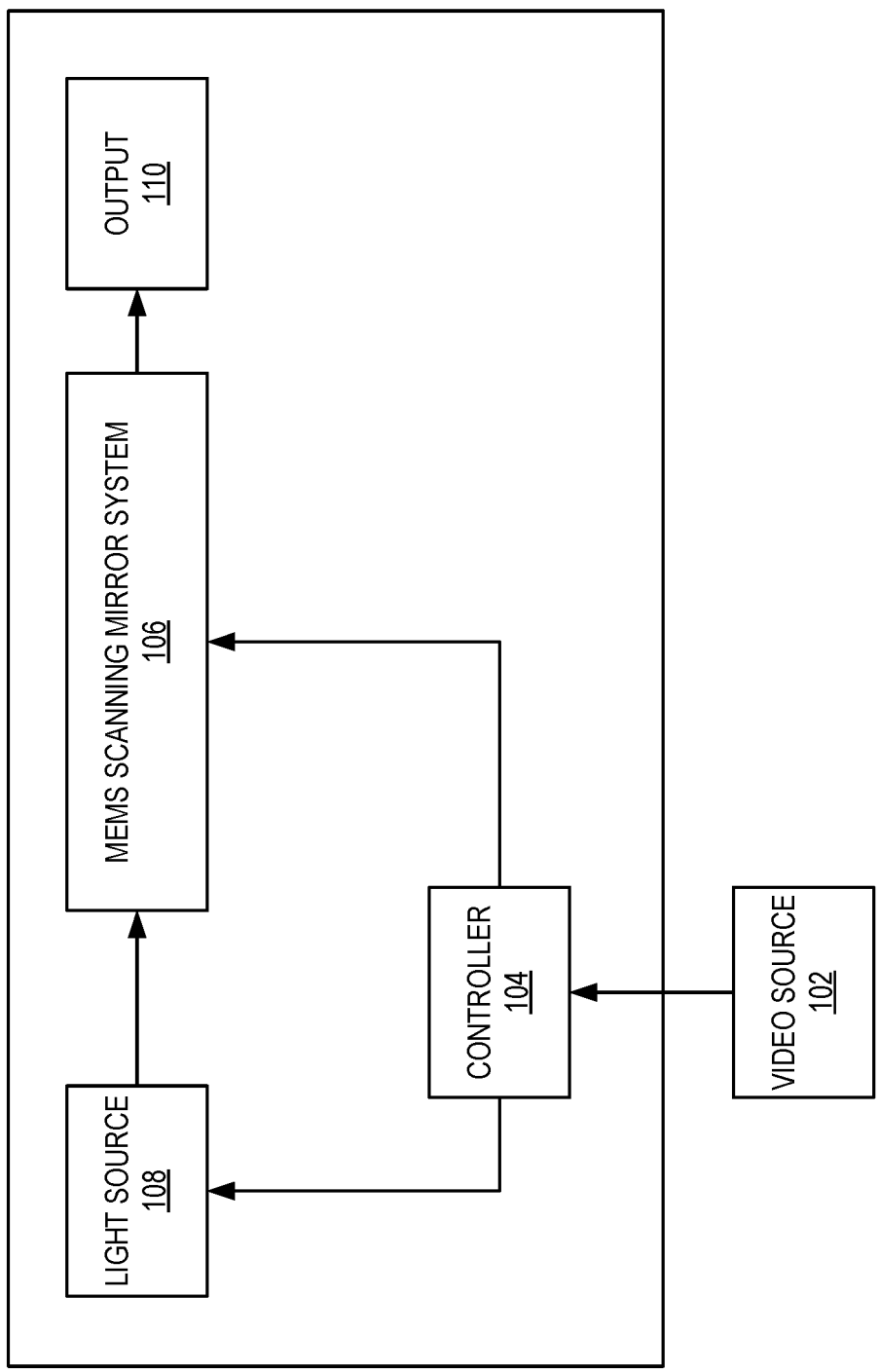
FIG. 1 is a schematic diagram illustrating an example display device that includes a microelectromechanical system (MEMS) scanning mirror system according to examples of the present disclosure.

FIG. 1 schematically illustrates an example display device 100 in communication with a video source 102. The display device 100 includes a controller 104 operatively coupled to an MEMS scanning mirror system 106 and to a light source 108. The controller 104 is configured to control the MEMS scanning mirror system 106 and the light source 108 to emit light based on video image data received from the video source 102. The light source 108 may include any suitable light-emitting elements, such as, but not limited to, one or more lasers and/or the like. The light source 108 may output light in any suitable wavelength ranges (e.g., red, green, and blue wavelength ranges that enable the production of color images). In other examples, the light source 108 may output substantially monochromatic light.

The MEMS scanning mirror system 106 includes one or more scanning mirrors (not shown in FIG. 1; e.g., the scanning mirror 216 shown in FIGS. 2-5) that are controllable (e.g., moveable, etc.) to vary an angle at which light from the light source 108 is reflected to thereby scan an image. The MEMS scanning mirror system 106 may include a single scanning mirror configured to scan light in horizontal and vertical directions, or separate scanning mirrors for separately scanning in the horizontal and vertical directions. In other examples, the MEMS scanning mirror system 106 may scan light in any other suitable manner via any suitable number of scanning mirrors.

The MEMS scanning mirror system 106 includes one or more actuators (not shown in FIG. 1; e.g., the actuators 214 shown in FIGS. 2-5, etc.) controllable to rotate the scanning mirror(s). As described in more detail below, the actuator(s) are mounted to one or more moveable members (not shown in FIG. 1; e.g., the moveable members 218 shown in FIGS. 2-5, etc.) of an actuator frame (not shown in FIG. 1; e.g., the actuator frame 210 shown in FIGS. 2-5, etc.). Light reflected by the scanning mirror(s) is directed toward an output 110 for display of a scanned image. The output 110 may take any suitable form, such as, but not limited to, projection optics, waveguide optics, and/or the like. In different examples, the display device 100 may be configured as a fully-immersive, virtual reality head-mounted display (HMD) device, a mixed reality HMD device that provides a view of a real-world environment, and/or or any other suitable display device (e.g., a head-up display, a mobile device screen, a monitor, a television, etc.).

FIGS. 2-5 illustrate an example MEMS scanning mirror system 206 according to examples of the present disclosure. The MEMS scanning mirror system 206 includes a scanning mirror assembly 208, and actuator frame 210, a substrate 212, and one or more actuators 214. The scanning mirror assembly 208 includes a scanning mirror 216. The actuator frame 210 includes one or more moveable members 218. In the examples shown herein, the actuator frame 210 includes two moveable members 218; however, the actuator frame 210 may include any number of the moveable members 218.

Figure 2:
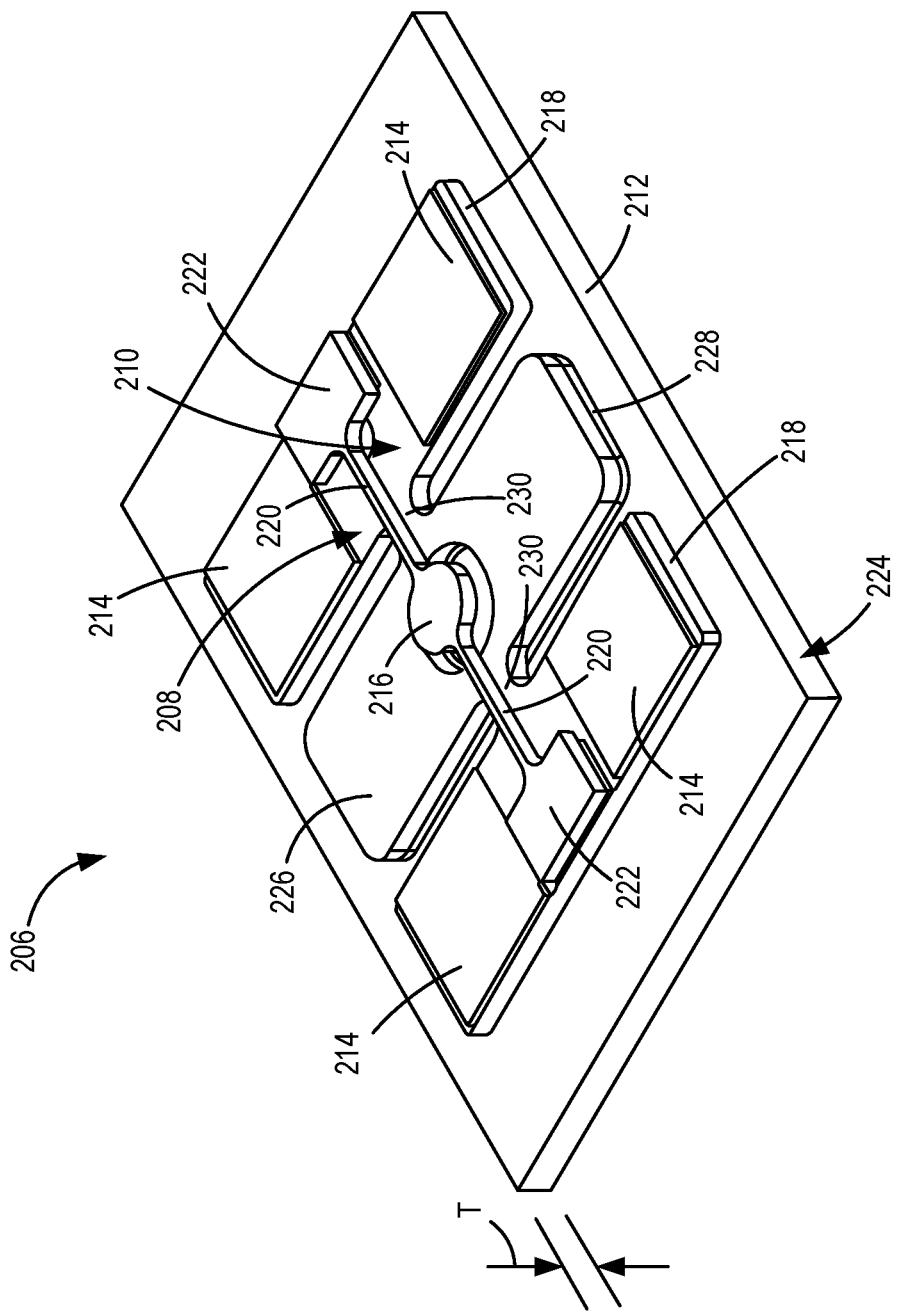
FIG. 2 is a perspective view illustrating an example of an MEMS scanning mirror system according to examples of the present disclosure.
Figure 3:
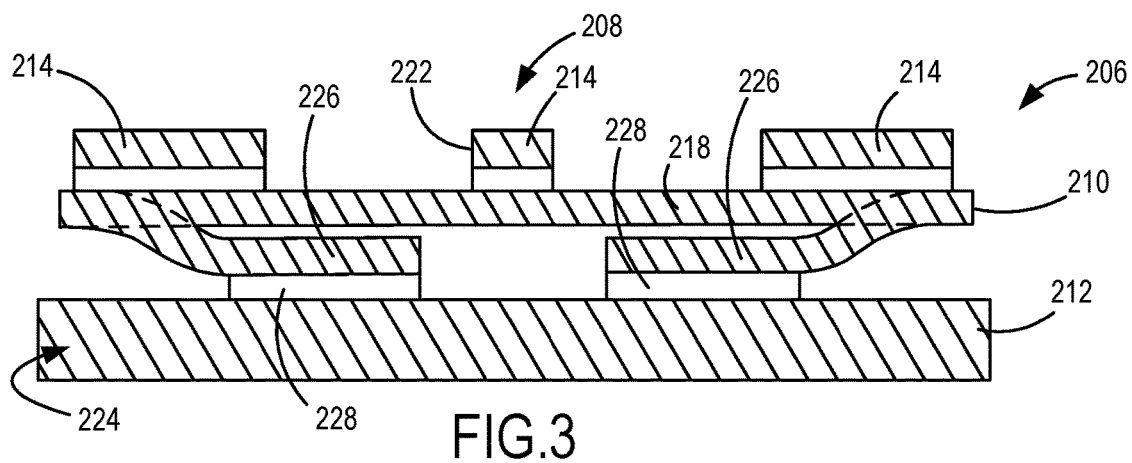
FIG. 3 is an elevational view of the MEMS scanning mirror system shown in FIG. 2.
Figure 4:
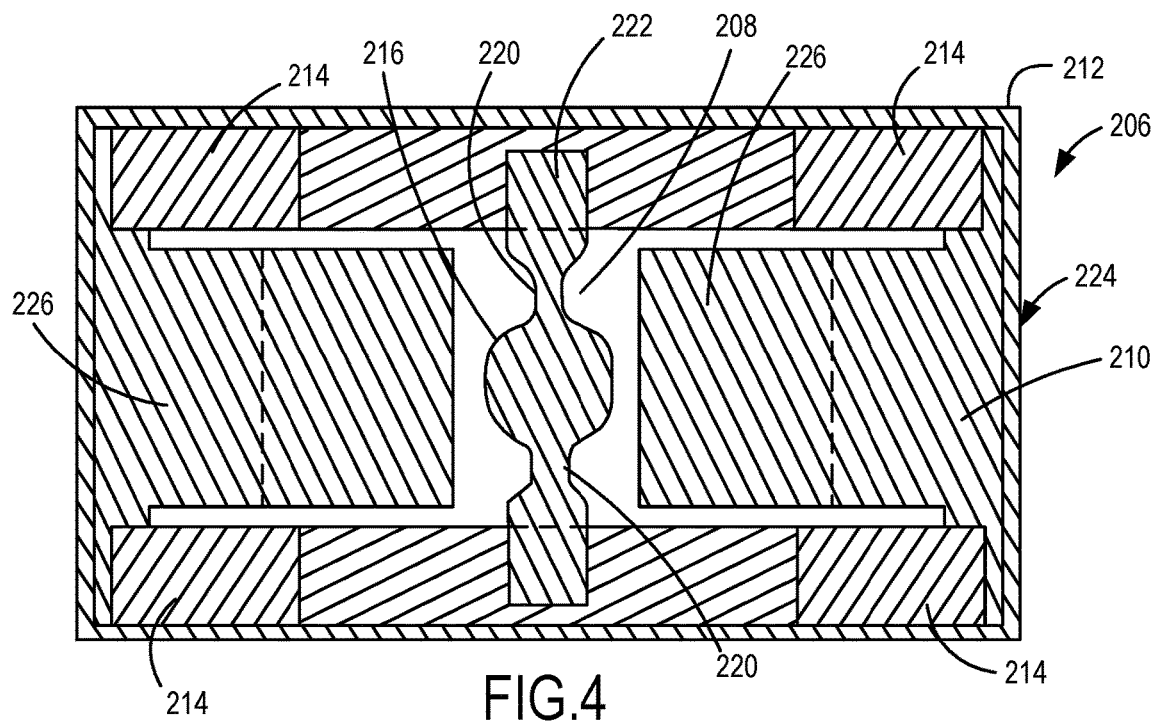
FIG. 4 is a plan view of the MEMS scanning mirror system shown in FIGS. 2 and 3.

The scanning mirror assembly 208 is mounted to the moveable members 218 of the actuator frame 210. Specifically, the scanning mirror assembly 208 includes flexures 220 (not visible in FIGS. 3 and 5). The scanning mirror 216 of the scanning mirror assembly 208 is mounted to the moveable members 218 via the flexures 220, as is shown in FIGS. 2 and 4. The flexures 220 may provide respective pivots by which the scanning mirror 216 can rotate and thereby change an angular orientation of the scanning mirror 216 to vary the angle at which light from a light source is reflected. The scanning mirror 216 may scan in a horizontal or vertical direction, depending upon an orientation in which the scanning mirror system 206 is incorporated into a display device.

Figure 5:
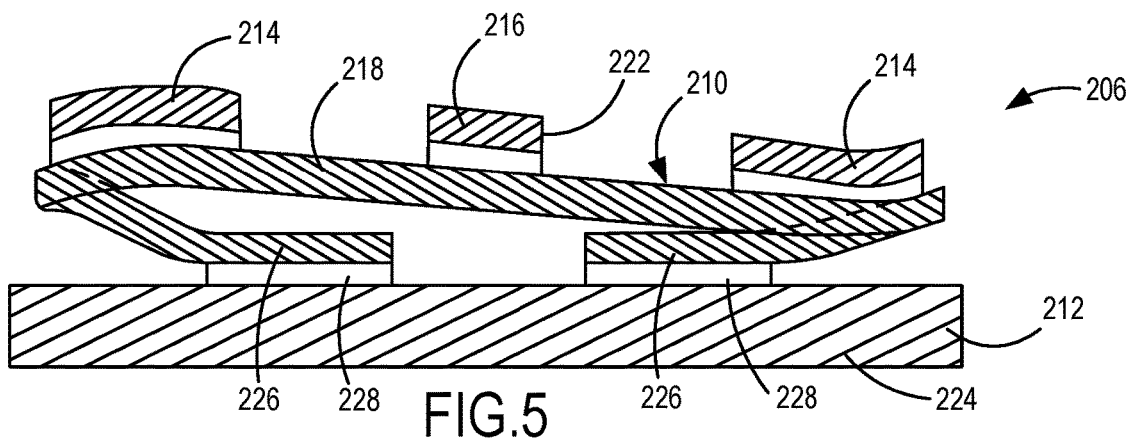
FIG. 5 is another elevational view illustrating motion of the MEMS scanning mirror system shown in FIGS. 2-4.

The flexures 220 of the scanning mirror assembly 208 are connected to corresponding anchor portions 222 that are affixed to corresponding ones of the moveable members 218 of the actuator frame 210. The actuators 214 are operatively connected to corresponding moveable members 218 such that the actuators 214 are configured to move the corresponding moveable members 218. The actuators 214 are controlled to cause corresponding movement of the scanning mirror 216 (e.g., to cause a desired oscillation in, and/or rotation of, the scanning mirror 216). Specifically, the flexures 220 of the scanning mirror assembly 208 mount the scanning mirror 216 to the moveable members 218 such that movement of the moveable members 218 driven by the actuators 214 moves (e.g., rotates, oscillates, etc.) the scanning mirror 216 of the scanning mirror assembly 208. FIG. 5 illustrates movement of the moveable members 218, and thus the scanning mirror 216, from the resting (e.g., beginning) position of the scanning mirror 216 shown in FIG. 3.

In the examples shown in FIGS. 2-5, the MEMS scanning mirror system 206 includes pairs of the actuators 214 operatively connected to a corresponding one of the moveable members 218, as is best seen in FIGS. 2 and 4. Although four of the actuators 214 are shown, the MEMS scanning mirror system 206 may include any number of the actuators 214. The actuators 214 may include piezoelectric (PZT) actuators that include a PZT material that changes dimension based upon an applied voltage. For example, upon receiving an electrical signal having a first polarity (e.g., positive), the actuators 214 may apply a contractive force to portions of the corresponding moveable member 218. An electrical signal having a second, different polarity (e.g., negative) may cause the actuators 214 to apply a dilative force to the corresponding moveable member 218. The magnitude of force applied by the actuators 214 may be controlled by controlling the magnitude of an electrical signal applied to the actuators 214.

In addition or alternatively to PZT actuators, the MEMS scanning mirror system 206 may utilize any other type of actuator that enables the MEMS scanning mirror system 206 to function as disclosed herein. For example, the actuators 214 may include a magnetic actuator, wherein a magnetic force between magnetic elements can be varied via electrical signal. In other examples, the actuators 214 include an electrostatic actuator, where an electric field between electrodes can be varied to adjust contractive or dilative forces. As a further example, the actuators 214 include one or more bimetallic strips, where differing coefficients of thermal expansion of different materials can be leveraged to vary the applied forces. It will also be appreciated that actuators 214 may be arranged at other suitable locations in the MEMS scanning mirror system 206.

The substrate 212 includes a body 224 and the actuator frame 210 is mounted on the body 224 of the substrate 212. In the examples shown in FIGS. 2-5, a central mounting member 226 of the actuator frame 210 is mounted on the body 224 of the substrate 212 by a spacer 228 (not visible in FIG. 4) such that the moveable members 218 of the actuator frame 210 float above the body 224 of the substrate 212. In other examples, a portion (e.g., the central mounting member 226) of the actuator frame 210 is mounted directly to the body 224 of the substrate 212 with no spacer therebetween.

In the examples shown in FIGS. 2-5, the actuator frame 210 comprises one or more hinges 230 that connects the mounting member 226 with a corresponding one of the moveable members 218. As best seen in FIG. 2, the hinges 230 are located substantially equidistant from opposite ends of the corresponding moveable members 218. Moreover, in the examples shown in FIGS. 2-5, the central mounting member 226 and the moveable members 218 include apertures (best seen in FIG. 2). It will be appreciated that in other examples, the central mounting member 226 and the moveable members 218 may have different configurations that include one or more apertures of different shapes, sizes, and/or locations, or configurations that include no apertures.

In some examples, the actuator frame 210 may include a metallic material, such as, but not limited to, steel. Additionally or alternatively to one or more metallic materials, the actuator frame 210 may include any other material(s) that enables the actuator frame 210 to function as disclosed herein.

The substrate 212 provides mechanical support to the actuator frame 210, the scanning mirror assembly 208, and the actuators 214. In some examples, the substrate 212 also provides an electrical interface to various components (e.g., the actuators 214, etc.) of the MEMS scanning mirror system 206. For example, the substrate 212 may be a circuit board having one or more electrical pathways, connections, and/or the like.

The substrate 212 is not intended to translate any movement of the actuators 214 to the scanning mirror assembly 208. In other words, the substrate 212 provides a relatively rigid mechanical support that is not intended to have any functional impact on a movement of the scanning mirror 216. As described above, the substrates of known MEMS scanning mirror systems are fabricated from a glass-reinforced plastic (i.e., fiberglass) material (e.g., FR4, etc.) that may flex and thereby generate parasite modes that cause exaggerated and/or unintentional movement of the scanning mirror. The exaggerated and/or unintentional movement of the scanning mirror caused by such parasite modes may cause audible noise and/or decrease the power efficiency of the MEMS scanning mirror system. Moreover, exaggerated and/or unintentional movement of the scanning mirror may increase component stresses and thereby reduce reliability of the MEMS scanning mirror system.

In the present disclosure, various parameters of the body 224 of the substrate 212 are selected to reduce or eliminate undesired resonant modes that may cause exaggerated and/or unintentional movement of the scanning mirror 216. For example, various parameters of the body 224 may be selected to provide the body 224 as stiffer than known substrates fabricated from glass-reinforced plastic such that the body 224 flexes less (e.g., as compared to the glass-reinforced plastic substrates of known MEMS scanning mirror systems, etc.) or not at all during operation of the MEMS scanning mirror system 206. Examples of parameters of the body 224 of the substrate 212 that may be selected to reduce or eliminate resonant modes that may cause exaggerated and/or unintentional movement of the scanning mirror 216, include, but are not limited to, the material(s) that compose the body 224, the elastic modulus of the body 224, the coefficient of thermal expansion (CTE) of the body 224, the dimensions of the body 224 (e.g., the thickness T of the body 224, the ratio of the surface area of the body 224 to the thickness T of the body 224, the length and/or width of the body 224, etc.), the shape of the body 224, the density of the body 224, and/or the like.

In some examples, the body 224 of the substrate 212 is fabricated such that the body 224 has an elastic modulus value that is configured to reduce or eliminate undesired resonant modes that may cause exaggerated and/or unintentional movement of the scanning mirror 216. For example, the body 224 may be provided with an elastic modulus of greater than or equal to approximately 58 gigapascals (GPa). In some examples, the body 224 of the substrate 212 is fabricated such that the body 224 has an elastic modulus of greater than or equal to approximately 100 GPa, greater than or equal to approximately 200 GPa, between approximately 60 GPa and approximately 500 GPa, or between approximately 200 GPa and approximately 400 GPa.

The material(s) used to fabricate the body 224, the dimensions (e.g., the thickness T, the ratio of the surface area to the thickness T, the length and/or width, etc.), the shape of the body 224, the density of the body 224, and/or other parameters may be selected to provide the body 224 with a predetermined elastic modulus value (e.g., the example elastic modulus values described above, etc.). In some examples, the material(s), dimensions, shape, density, and/or other parameters of the body 224 are selected to reduce or maintain the weight of the MEMS scanning mirror system 206. Moreover, the material(s), dimensions, shape, density, and/or other parameters of the body 224 may be selected to increase the stiffness of the body 224 (e.g., compared to known substrates fabricated from glass-reinforced plastic, etc.) for a given weight and/or size (e.g., thickness, length, width, surface area to thickness ratio, etc.) of the MEMS scanning mirror system 206.

In some examples, the body 224 of the substrate 212 is fabricated such that the body 224 has a CTE value that is: (1) configured to reduce or eliminate undesired resonant modes that may cause exaggerated and/or unintentional movement of the scanning mirror 216; and/or (2) is configured to reduce component stresses during assembly of the MEMS scanning mirror system 206. For example, the body 224 may be provided with a CTE of less than or equal to approximately 10 parts per million (ppm)/K. In some examples, the body 224 of the substrate 212 is fabricated such that the body 224 has a CTE of less than or equal to approximately 8 ppm/K, less than or equal to approximately 5 ppm/K, between approximately 5 ppm/K, or between approximately 6 ppm/K and 8 ppm/K. The material(s) used to fabricate the body 224, the dimensions (e.g., the thickness T, the ratio of the surface area to the thickness T, the length and/or width, etc.), a shape of the body 224, a density of the body 224, and/or other parameters may be selected to provide the body 224 with a predetermined CTE value (e.g., the example CTE values described above, etc.).

In some examples, the body 224 of the substrate 212 is fabricated from one or more ceramic materials such that the body 224 is a ceramic body. The body 224 may include any ceramic materials, such as, but not limited to, aluminum oxide, zirconia-dispersed alumina, aluminum nitride, silicon nitride, a low-temperature co-fired ceramic (LTCC), a cermet, a ceramic matrix composite (CMC), an oxide ceramic, a non-oxide ceramic, and/or a composite material that includes one or more ceramic materials. Other ceramic materials are contemplated for use with the body 224 of the substrate 212 within the scope of the present disclosure.

In examples wherein the body 224 of the substrate 212 is a ceramic body 224, the body 224 may have any thickness T and may have any ratio of the surface area of the body 224 to the thickness T that enables the ceramic body 224 to reduce or eliminate undesired resonant modes that may cause exaggerated and/or unintentional movement of the scanning mirror 216. For example, the ceramic body 224 may have a thickness T of at least approximately 0.5 millimeters (mm). In some examples, the ceramic body 224 has a thickness T of at least approximately 1.0 mm, at least approximately 2.0 mm, between approximately 0.5 mm and approximately 5 mm, between approximately 0.9 mm and approximately 4 mm, or greater than approximately 5 mm. As described above, the thickness T of the ceramic body 224 may be selected to enable the body 224 to reduce or eliminate undesired resonant modes while: (1) reducing or maintaining a weight of the MEMS scanning mirror system 206; and/or increasing the stiffness of the body 224 (e.g., compared to known substrates fabricated from glass-reinforced plastic, etc.) for a given weight and/or size (e.g., thickness, length, width, surface area to thickness ratio, etc.) of the MEMS scanning mirror system 206.

The body 224 of the substrate 212 may be fabricated from any other material(s) in addition or alternatively to one or more ceramic materials to enable the body 224 to reduce or eliminate undesired resonant modes that may cause exaggerated and/or unintentional movement of the scanning mirror 216. Examples of such other materials used to fabricate the body 224 of the substrate 212 include, but are not limited to, silicon, sapphire, diamond, and/or the like.

For example, materials such as, but not limited to, silicon, sapphire, diamond, and/or the like may be used to fabricate the body 224 to increase the stiffness of the body 224 (e.g., compared to known substrates fabricated from glass-reinforced plastic, etc.) and/or provide the body 224 with a predetermined CTE value.

The examples disclosed herein provide a substrate for an MEMS scanning mirror system that reduces or eliminates undesired resonant modes that may cause exaggerated and/or unintentional movement of a scanning mirror of the MEMS scanning mirror system. The substrate examples disclosed herein thus reduce or eliminate audible noise (e.g., via the reduction or elimination of parasite mode excitation, etc.) and/or increase the power efficiency of the MEMS scanning mirror system. Moreover, the substrate examples disclosed herein decrease component stresses generated during operation and/or assembly of the MEMS scanning mirror system and thereby increase reliability of the MEMS scanning mirror system.

Figure 6:
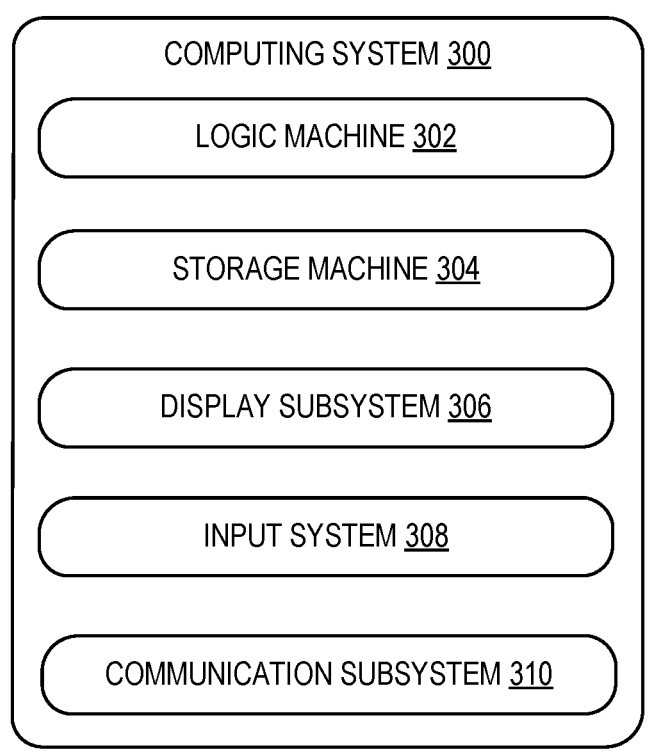
FIG. 6 is a block diagram illustrating an example computing system according to examples of the present disclosure.

FIG. 6 is a schematic diagram illustrating an example of a computing system 300 that may be utilized with and/or incorporated into the display devices and MEMS scanning mirror systems disclosed herein. Computing system 300 is shown in simplified form. Computing system 300 may take the form of one or more virtual reality HMD devices, mixed reality HMD devices, head-up display devices, mobile device screens, monitors, televisions, personal computers, tablet computers, home-entertainment computers, gaming devices, mobile computing devices, mobile communication devices (e.g., smart phones, etc.), and/or other computing devices.

Computing system 300 includes a logic machine 302 and a storage machine 304. Computing system 300 optionally includes a display subsystem 306, an input subsystem 308, a communication subsystem 310, and/or other components not shown in FIG. 6.

Logic machine 302 includes one or more physical devices configured to execute instructions. For example, the logic machine 302 may be configured to execute instructions that are part of one or more applications, services, programs, routines, libraries, objects, components, data structures, other logical constructs, and/or the like. Such instructions may be implemented to perform a task, implement a data type, transform the state of one or more components, achieve a technical effect, and/or otherwise arrive at a desired result.

The logic machine 302 may include one or more processors or controllers configured to execute software instructions. Additionally or alternatively, the logic machine 302 may include one or more hardware or firmware logic machines configured to execute hardware or firmware instructions. Processors of the logic machine 302 may be single-core or multi-core, and the instructions executed thereon may be configured for sequential, parallel, and/or distributed processing. Individual components of the logic machine 302 are optionally distributed among two or more separate devices, which may be remotely located and/or configured for coordinated processing. Aspects of the logic machine 302 may be virtualized and executed by remotely accessible, networked computing devices configured in a cloud-computing configuration.

The storage machine 304 includes one or more physical devices configured to hold instructions executable by the logic machine 302 to operate the display devices and/or MEMS scanning mirror systems disclosed herein. During operation of the display devices and/or MEMS scanning mirror system disclosed herein, the state of the storage machine 304 may be transformed—e.g., to hold different data.

The storage machine 304 may include removable and/or built-in devices. It will be appreciated that storage machine 304 includes one or more physical devices. However, aspects of the instructions described herein alternatively may be propagated by a communication medium (e.g., an electromagnetic signal, an optical signal, etc.) that is not held by a physical device for a finite duration. Computer executable instructions may be provided using any computer-readable media that are accessible by the computing system 300. Computer-readable media may include, for example, computer storage media such as a memory and communications media. Computer storage media, such as a memory, include volatile and non-volatile, removable and non-removable media implemented in any method or technology for storage of information such as computer readable instructions, data structures, program modules or the like. Computer storage media include, but are not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing apparatus. In contrast, communication media may embody computer readable instructions, data structures, program modules, or the like in a modulated data signal, such as a carrier wave, or other transport mechanism. As defined herein, computer storage media do not include communication media. Therefore, a computer storage medium should not be interpreted to be a propagating signal per se. Propagated signals per se are not examples of computer storage media.

Aspects of the logic machine 302 and the storage machine 304 may be integrated together into one or more hardware-logic components. For example, such hardware-logic components may include field-programmable gate arrays (FPGAs), program and application-specific integrated circuits (PASIC/ASICs), program and application-specific standard products (PSSP/ASSPs), system-on-a-chip (SOC), complex programmable logic devices (CPLDs), etc.

The terms "module," "program," and "engine" may be used to describe an aspect of the computing system 300 implemented to perform a particular function. In some examples, a module, program, and/or engine may be instantiated via the logic machine 302 executing instructions held by the storage machine 304. It should be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, and/or the like.

It will be appreciated that a "service", as used herein, is an application program executable across multiple user sessions. A service may be available to one or more system components, programs, and/or other services. In some implementations, a service may run on one or more server-computing devices.

When included, the display subsystem 306 may be used to present a visual representation of data held by the storage machine 304. Similar to how the data held by the storage machine 304 is changed, and thus the state of the storage machine 304 is transformed, the state of the display subsystem 306 may likewise be transformed to visually represent changes in the underlying data. The display subsystem 306 may include one or more display devices utilizing any type of technology. Such display devices may be combined with the logic machine 302 and/or the storage machine 304 in a shared enclosure, or such display devices may be peripheral display devices.

When included, the input subsystem 308 may comprise or interface with one or more user-input devices such as, but not limited to, a keyboard, mouse, touch screen, game controller, other input device, and/or the like. In some examples, the input subsystem 308 may comprise or interface with selected natural user input (NUI) componentry. Such componentry may be integrated or peripheral, and the transduction and/or processing of input actions may be handled on or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; electric-field sensing componentry for assessing brain activity; and/or the like.

When included, the communication subsystem 310 may be configured to communicatively couple with one or more other computing devices. The communication subsystem 310 may include wired and/or wireless communication devices compatible with one or more different communication protocols. As non-limiting examples, the communication subsystem 310 may be configured for communication via a wireless telephone network, or a wired or wireless local or wide-area network. In some embodiments, the communication subsystem 310 may allow the computing system 300 to send and/or receive messages to and/or from other devices via a network (e.g., the Internet, etc.).

Alternatively or in addition to the other examples described herein, examples include any combination of the following:

A microelectromechanical system (MEMS) scanning mirror system, comprising:
 a substrate comprising a ceramic body;
 an actuator frame mounted on the ceramic body of the substrate, the actuator frame comprising at least one moveable member;
 at least one actuator operatively connected to the at least one moveable member such that the actuator is configured to move the at least one moveable member; and
 a scanning mirror assembly mounted to the at least one moveable member such that movement of the at least one moveable member moves the scanning mirror assembly.
 wherein the ceramic body of the substrate comprises at least one of aluminum oxide, zirconia-dispersed alumina, aluminum nitride, silicon nitride, a low-temperature co-fired ceramic (LTCC), a cermet, a ceramic matrix composite (CMC), an oxide ceramic, a non-oxide ceramic, or a composite material.
 wherein the ceramic body of the substrate comprises an elastic modulus of greater than or equal to approximately 58 gigapascals (GPa).
 wherein the ceramic body of the substrate comprises a thickness of at least approximately 0.5 millimeters (mm).
 wherein the ceramic body of the substrate comprises a thickness of at least approximately 1.0 millimeters (mm).
 wherein the ceramic body of the substrate comprises a coefficient of thermal expansion (CTE) of less than or equal to approximately 10 parts per million (ppm)/K.
 wherein the actuator frame comprises a mounting member mounted on the ceramic body of the substrate, the mounting member being connected to the at least one moveable member such that the at least one moveable member floats above the substrate.
 wherein the at least one actuator comprises a piezoelectric (PZT) actuator.

A microelectromechanical system (MEMS) scanning mirror system, comprising:
 a substrate comprising a body having an elastic modulus of greater than or equal to approximately 58 gigapascals (GPa);
 an actuator frame mounted on the body of the substrate, the actuator frame comprising at least one moveable member;
 at least one actuator operatively connected to the at least one moveable member such that the actuator is configured to move the at least one moveable member; and
 a scanning mirror assembly mounted to the at least one moveable member such that movement of the at least one moveable member moves the scanning mirror assembly.
 wherein the body of the substrate comprises at least one of a ceramic, silicon, sapphire, or diamond.
 wherein the body of the substrate comprises a thickness of at least approximately 0.5 millimeters (mm).
 wherein the body of the substrate comprises a thickness of at least approximately 1.0 millimeters (mm).
 wherein the body of the substrate comprises a coefficient of thermal expansion (CTE) of less than or equal to approximately 10 parts per million (ppm)/K.
 wherein the at least one actuator comprises a piezoelectric (PZT) actuator.

A display device comprising:
 a light source;
 a microelectromechanical system (MEMS) scanning mirror system comprising:
  a substrate comprising a ceramic body;
  an actuator frame mounted on the ceramic body of the substrate, the actuator frame comprising at least one moveable member;
  at least one actuator operatively connected to the at least one moveable member such that the actuator is configured to move the at least one moveable member; and
  a scanning mirror assembly mounted to the at least one moveable member such that movement of the at least one moveable member moves the scanning mirror assembly; and
 a controller operatively connected to the light source and the MEMS scanning mirror system, the controller being configured to control the MEMS scanning mirror system and the light source to emit light based on video image data received from a video source.
 wherein the ceramic body of the substrate of the MEMS scanning mirror system comprises at least one of aluminum oxide, zirconia-dispersed alumina, aluminum nitride, silicon nitride, a low-temperature co-fired ceramic (LTCC), a cermet, a ceramic matrix composite (CMC), an oxide ceramic, a non-oxide ceramic, or a composite material.
 wherein the ceramic body of the substrate of the MEMS scanning mirror system comprises an elastic modulus of greater than or equal to approximately 58 gigapascals (GPa).
 wherein the ceramic body of the substrate of the MEMS scanning mirror system comprises a thickness of at least approximately 0.5 millimeters (mm).
 wherein the ceramic body of the substrate of the MEMS scanning mirror system comprises a thickness of at least approximately 1.0 millimeters (mm).

wherein the ceramic body of the substrate of the MEMS scanning mirror system comprises a coefficient of thermal expansion (CTE) of less than or equal to approximately 10 parts per million (ppm)/K.

It is to be understood that the above description is intended to be illustrative, and not restrictive. For example, the above-described embodiments, examples, and aspects may be used in combination with each other. Furthermore, invention(s) have been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention(s). Further, each independent feature or component of any given assembly may constitute an additional embodiment. In addition, many modifications may be made to adapt a particular situation or material to the teachings of the disclosure without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the disclosure should, therefore, be determined with reference to the appended claims, along with the full scope of equivalents to which such claims are entitled.

In the foregoing description of certain embodiments, specific terminology has been resorted to for the sake of clarity. However, the disclosure is not intended to be limited to the specific terms so selected, and it is to be understood that each specific term includes other technical equivalents which operate in a similar manner to accomplish a similar technical purpose. Terms such as "clockwise" and "counterclockwise", "left" and right", "top", "bottom", "front" and "rear", "above" and "below" and the like are used as words of convenience to provide reference points and are not to be construed as limiting terms.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. For example, in this specification, the word "comprising" is to be understood in its "open" sense, that is, in the sense of "including", and thus not limited to its "closed" sense, that is the sense of "consisting only of". A corresponding meaning is to be attributed to the corresponding words "comprise", "comprised", "comprises", "having", "has", "includes", and "including" where they appear. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property can include additional elements not having that property. The term "exemplary" is intended to mean "an example of." The phrase "one or more of the following: A, B, and C" means "at least one of A and/or at least one of B and/or at least one of C." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

Although the terms "step" and/or "block" may be used herein to connote different elements of methods employed, the terms should not be interpreted as implying any particular order among or between various steps herein disclosed unless and except when the order of individual steps is explicitly described. The order of execution or performance of the operations in examples of the disclosure illustrated and described herein is not essential, unless otherwise specified. The operations may be performed in any order, unless otherwise specified, and examples of the disclosure may include additional or fewer operations than those disclosed herein. It is therefore contemplated that executing or performing a particular operation before, contemporaneously with, or after another operation is within the scope of aspects of the disclosure.

Having described aspects of the disclosure in detail, it will be apparent that modifications and variations are possible without departing from the scope of aspects, embodiments, and examples of the disclosure as defined in the appended claims. As various changes could be made in the above constructions, products, systems, and methods without departing from the scope of aspects of the disclosure, it is intended that all matter contained in the above description and shown in the accompanying drawings shall be interpreted as illustrative and not in a limiting sense.

The invention claimed is:

1. A microelectromechanical system (MEMS) scanning mirror system, comprising:
    a substrate comprising a ceramic body;
    an actuator frame mounted on the ceramic body of the substrate, the actuator frame comprising at least one moveable member;
    at least one actuator operatively connected to the at least one moveable member such that the actuator is configured to move the at least one moveable member; and
    a scanning mirror assembly mounted to the at least one moveable member such that movement of the at least one moveable member moves the scanning mirror assembly, the scanning mirror assembly spaced above an upper surface of the substrate, the upper surface of the substrate forming a continuous plane from a mounting position of the actuator frame to a position below the scanning mirror assembly.

2. The MEMS scanning mirror system of claim 1, wherein the ceramic body of the substrate comprises one or more of the following: aluminum oxide, zirconia-dispersed alumina, aluminum nitride, silicon nitride, a low-temperature co-fired ceramic (LTCC), a cermet, a ceramic matrix composite (CMC), an oxide ceramic, a non-oxide ceramic, or a composite material.

3. The MEMS scanning mirror system of claim 1, wherein the ceramic body of the substrate comprises an elastic modulus of greater than or equal to approximately 58 gigapascals (GPa).

4. The MEMS scanning mirror system of claim 1, wherein the ceramic body of the substrate comprises a thickness of at least 0.5 millimeters (mm).

5. The MEMS scanning mirror system of claim 1, wherein the ceramic body of the substrate comprises a thickness of at least 1.0 millimeters (mm).

6. The MEMS scanning mirror system of claim 1, wherein the ceramic body of the substrate comprises a coefficient of thermal expansion (CTE) of less than or equal to 10 parts per million (ppm)/K.

7. The MEMS scanning mirror system of claim 1, wherein the actuator frame comprises a mounting member mounted on the ceramic body of the substrate, such that the at least one moveable member is connected to and at least partially spaced above the mounting member, and such that the at least one moveable member is spaced above the substrate.

8. The MEMS scanning mirror system of claim 1, wherein the at least one actuator comprises a piezoelectric (PZT) actuator.

9. A microelectromechanical system (MEMS) scanning mirror system, comprising:
   a substrate comprising a body having an elastic modulus of greater than or equal to approximately 58 gigapascals (GPa);
   an actuator frame mounted on the body of the substrate, the actuator frame comprising at least one moveable member;
   at least one actuator operatively connected to the at least one moveable member such that the actuator is configured to move the at least one moveable member; and
   a scanning mirror assembly mounted to the at least one moveable member such that movement of the at least one moveable member moves the scanning mirror assembly, the scanning mirror assembly spaced above an upper surface of the substrate, the upper surface of the substrate forming a continuous plane from a mounting position of the actuator frame to a position below the scanning mirror assembly.

10. The MEMS scanning mirror system of claim 9, wherein the body of the substrate comprises one or more of the following: a ceramic, silicon, sapphire, and diamond.

11. The MEMS scanning mirror system of claim 9, wherein the body of the substrate comprises a thickness of at least 0.5 millimeters (mm).

12. The MEMS scanning mirror system of claim 9, wherein the body of the substrate comprises a thickness of at least 1.0 millimeters (mm).

13. The MEMS scanning mirror system of claim 9, wherein the body of the substrate comprises a coefficient of thermal expansion (CTE) of less than or equal to approximately 10 parts per million (ppm)/K.

14. The MEMS scanning mirror system of claim 9, wherein the at least one actuator comprises a piezoelectric (PZT) actuator.

15. A display device comprising:
   a light source;
   a microelectromechanical system (MEMS) scanning mirror system comprising:
      a substrate comprising a ceramic body;
      an actuator frame mounted on the ceramic body of the substrate, the actuator frame comprising at least one moveable member;
      at least one actuator operatively connected to the at least one moveable member such that the actuator is configured to move the at least one moveable member; and
      a scanning mirror assembly mounted to the at least one moveable member such that movement of the at least one moveable member moves the scanning mirror assembly, the scanning mirror assembly spaced above an upper surface of the substrate, the upper surface of the substrate forming a continuous plane from a mounting position of the actuator frame to a position below the scanning mirror assembly; and
   a controller operatively connected to the light source and the MEMS scanning mirror system, the controller being configured to control the MEMS scanning mirror system and the light source to emit light based on video image data received from a video source.

16. The display device of claim 15, wherein the ceramic body of the substrate of the MEMS scanning mirror system comprises at least one of aluminum oxide, zirconia-dispersed alumina, aluminum nitride, silicon nitride, a low-temperature co-fired ceramic (LTCC), a cermet, a ceramic matrix composite (CMC), an oxide ceramic, a non-oxide ceramic, or a composite material.

17. The display device of claim 15, wherein the ceramic body of the substrate of the MEMS scanning mirror system comprises an elastic modulus of greater than or equal to approximately 58 gigapascals (GPa).

18. The display device of claim 15, wherein the ceramic body of the substrate of the MEMS scanning mirror system comprises a thickness of at least 0.5 millimeters (mm).

19. The display device of claim 15, wherein the ceramic body of the substrate of the MEMS scanning mirror system comprises a thickness of at least 1.0 millimeters (mm).

20. The display device of claim 15, wherein the ceramic body of the substrate of the MEMS scanning mirror system comprises a coefficient of thermal expansion (CTE) of less than or equal to 10 parts per million (ppm)/K.

* * * * *